United States Patent
Binnard et al.

(10) Patent No.: US 6,963,821 B2
(45) Date of Patent: Nov. 8, 2005

(54) STAGE COUNTER MASS SYSTEM

(75) Inventors: Michael Binnard, Belmont, CA (US); W. Thomas Novak, Hillsborough, CA (US); Toshio Ueta, Menuma-machi (JP); Bausan Yuan, San Jose, CA (US)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 10/361,700

(22) Filed: Feb. 11, 2003

(65) Prior Publication Data

US 2004/0158427 A1 Aug. 12, 2004

(51) Int. Cl.[7] ................................................ G01B 11/24
(52) U.S. Cl. ...................................... 702/169; 355/75
(58) Field of Search ........................ 702/169, 95, 187, 702/151, 54, 456, 94; 355/75, 72; 318/649; 250/491.1

(56) References Cited

U.S. PATENT DOCUMENTS

| | | | |
|---|---|---|---|
| 4,655,594 A | 4/1987 | Wittekoek et al. | |
| 5,699,621 A | 12/1997 | Trumper et al. | |
| 5,969,441 A | 10/1999 | Loopstra et al. | |
| 6,246,204 B1 | 6/2001 | Ebihara et al. | |
| 6,262,796 B1 | 7/2001 | Loopstra et al. | |
| 6,408,045 B1 * | 6/2002 | Matsui et al. | 378/34 |
| 6,449,030 B1 | 9/2002 | Kwan | |
| 6,486,941 B1 | 11/2002 | Hazelton et al. | |
| 6,525,803 B2 | 2/2003 | Kwan et al. | |
| 2002/0017890 A1 * | 2/2002 | Ebihara et al. | 318/649 |
| 2002/0179850 A1 * | 12/2002 | Novak et al. | 250/491.1 |
| 2002/0196421 A1 * | 12/2002 | Tanaka et al. | 355/72 |
| 2003/0067592 A1 * | 4/2003 | Poon et al. | 355/75 |

OTHER PUBLICATIONS

U.S. Appl. No. 10/325,916, filed on Dec. 23, 2002.

* cited by examiner

*Primary Examiner*—Michael Nghiem
*Assistant Examiner*—Xiuqin Sun
(74) *Attorney, Agent, or Firm*—Greenblum & Bernstein, P.L.C.

(57) ABSTRACT

A wafer stage countermass assembly generally includes a base supporting one or more stages and first and second countermasses. The first and second stages move in one or more degrees of freedom. The countermasses move in at least one degree of freedom and, under ideal conditions, move to counter the movement of the stages in operation and thus preserve the systems center of gravity to avoid unwanted body motion. However, under actual conditions the countermasses may under travel or over travel their ideal trajectory. To more closely track the ideal trajectory, a controller actuates trim motors to apply small forces to the countermasses to push them towards a reference position in the Y direction. A second embodiment also takes into account the X position the stage(s) to cancel torque.

39 Claims, 9 Drawing Sheets

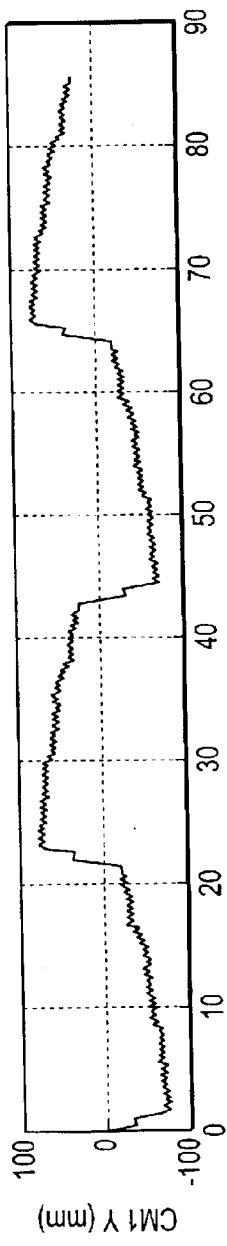
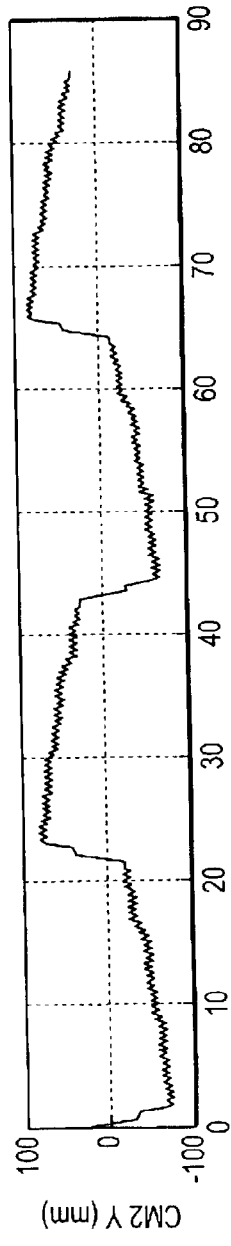
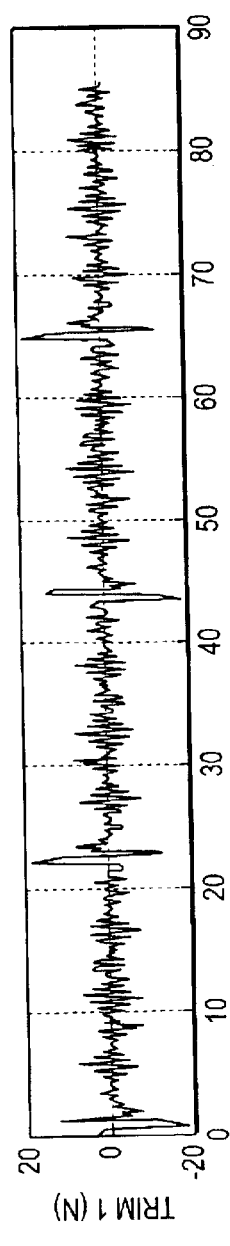
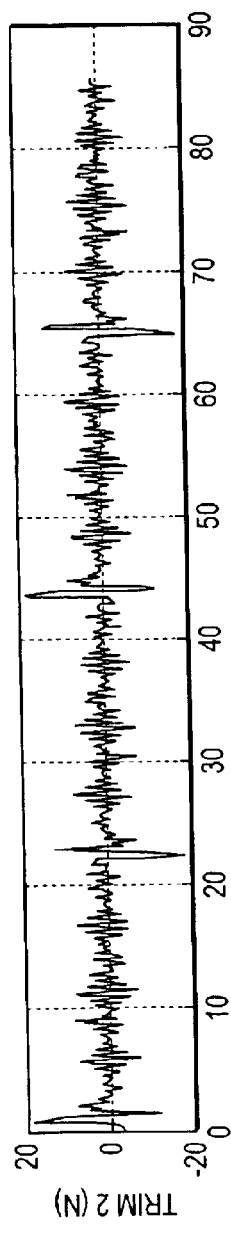
FIG. 4A
FIG. 4B
FIG. 4C
FIG. 4D

STAGE COUNTER MASS SYSTEM

BACKGROUND OF THE INVENTION

1. Field of the Invention

The present invention generally relates to stages and, more particularly, to the positioning of a counter mass to dampen vibrations caused when the stage is driven.

2. Description of the Prior Art

When a semiconductor element is manufactured, a projection exposure apparatus is used to transfer an image of a pattern (reticle), used as a mask, onto areas of a resist coated wafer. Two common types of projection systems include batch exposure type step-and-repeat optical projection apparatuses (stepper), and scanning exposure type projection exposure apparatuses (step-and-scan type), which perform an exposure as the reticle and the wafer are synchronously scanned with respect to an optical projection system.

In conventional systems, such as steppers and step and scan systems, for example, the reticle stage which supports and carries the reticle having the original pattern, the wafer to which the pattern is to be transferred, and the driving part of the wafer stage, are fixed to a structural body that supports the optical projection system. In order to position a wafer stage with high accuracy, the position of the wafer stage is measured by a laser interferometer, and a moving mirror for the laser interferometer is fixed to the wafer stage.

As described above, in the conventional systems, the driving part of the wafer stage or the like and the projection optical system are fixed to the same structural body. The vibration generated by the driving reaction of the stage is transmitted to the structural body, and the vibration is also transmitted to the optical projection system which can cause position shifting of the transfer pattern image and deterioration of contrast.

To minimize this vibration problem, many lithography machines have a moving counter-weight (or counter mass) to preserve the location of the center of gravity of the stage system during any stage motion by using the conservation of momentum principle. As disclosed, a drive assembly includes a drive frame carrying linear motors suspended above a base structure. When the drive assembly applies an action force to the stage to move the stage in one direction over the base structure, the driving frame, acting as the counter weight, moves in the opposite direction in response to the reaction force to substantially maintain the center of gravity of the whole stage apparatus. This apparatus essentially eliminates any reaction forces between the stage system and the base structure on which the stage system is mounted, thereby facilitating high acceleration while minimizing vibrational effects on the system.

Recently, modem wafer stages require larger driving forces. For example, if the stage weighs 180 kg, the driving force required to move this stage at the required acceleration (2 g's) and speed is $2*9.8 m/s^2*180 kg=3528 N$. For such a large force, the reaction force shakes the system, and degrades the system accuracy. To avoid this phenomenon, the wafer exposure system may use a counter mass as noted above.

It is thus realized that modem lithographic machines of suffer from many problems. These problems range from stability requirements and more particularly vibrations and shaking of the wafer stage with use of large driving forces. The shaking and vibrations lead to system degradation including poor lithographic processing of wafers. The present state of the art, however, is not designed to compensate for these inefficiencies.

SUMMARY OF THE INVENTION

The present invention provides for a method for maintaining a center of gravity for a stage and a countermass system in a fixed location comprising at least one moving stage and at least two countermasses. The method includes calculating a target position for the at least two countermasses according to a position of the at least one stage and pushing the at least two countermasses towards the target position based on the calculating step.

In another aspect of the present invention a control method is provided for maintaining a center of gravity for a stage and a countermass system comprising a moving stage and at least two countermasses having different target positions. The method includes calculating the target positions for the at least two countermasses according to a position of the stage. The calculating step allows for a weight factor to trade off torque cancellation for reduced countermass stroke. The method of this aspect of the present invention further includes pushing the at least two countermasses towards the different target positions.

In yet another aspect of the present invention, a system is provided for maintaining a center of gravity for a stage and a countermass system in a fixed location comprising at least one moving stage and at least two countermasses. The system includes a controller for calculating a target position for the at least two countermasses according to a position of the at least one stage and a motor for pushing the at least two countermasses towards the target position based on the calculating.

In still another aspect of the present invention, a control system is provided for maintaining a center of gravity for a stage and a countermass system comprising a moving stage and at least two countermasses having different target positions. In this aspect of the present invention, a controller calculates the target positions for the at least two countermasses according to a position of the stage, where the controller, during the calculating step, allows for a weight factor to trade off torque cancellation for reduced countermass stroke. A motor pushes the at least two countermasses towards the two different target positions.

In a further aspect of the present invention, a system is provided for maintaining a center of gravity for a stage and a countermass system in a fixed location comprising at least one moving stage and at least two countermasses. The system comprising means for calculating a target position for the at least two countermasses according to a position of the at least one stage and means for pushing the at least two countermasses towards the target position based on the calculating step.

In yet a further aspect of the present invention, a system is provided for maintaining a center of gravity for a stage and a countermass system in a fixed location. The system includes at least two countermasses and at least one guide bar having at least one stage disposed thereon, respectively. The at least one guide bar is mounted to the at least two countermasses. A controller calculates a target position for the at least two countermasses according to a position of the at least one stage and a motor pushes the at least two countermasses toward the target positions.

In another aspect of the present invention, an exposure apparatus is provided. In the exposure apparatus, an illumination system is provided for projecting radiant energy through a mask pattern on a reticle. A system reduces a stroke of at least two countermasses in an assembly comprising at least one moving stage and the at least two countermasses. The radiant energy is projected on a wafer which is positioned on the at least one moving stage. The system includes a controller for calculating a target position for the at least two countermasses according to a position of the at least one stage and a motor for pushing the at least two countermasses towards the target position based on the calculating.

BRIEF DESCRIPTION OF THE DRAWINGS

The foregoing and other aspects and advantages will be better understood from the following detailed description of a preferred embodiment of the invention with reference to the drawings, in which:

FIGS. 4A–D are plots showing time-domain simulation results where the positions of the two countermasses are shown in the top two graphs (4A and 4B), and the bottom two graphs show the trim motor forces (4C and 4D);

DETAILED DESCRIPTION OF A PREFERRED EMBODIMENT OF THE INVENTION

Figure 1:
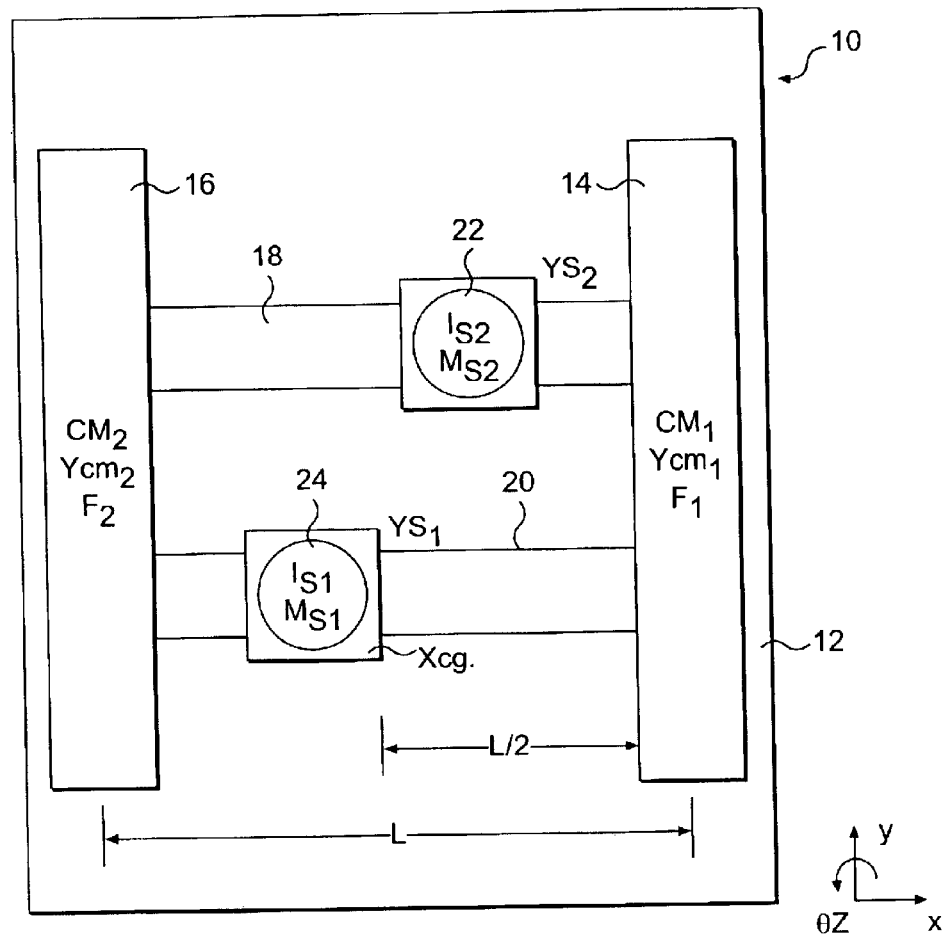
FIG. 1 is a top view of an exemplary embodiment of a wafer stage according to the present invention.
Figure 2:
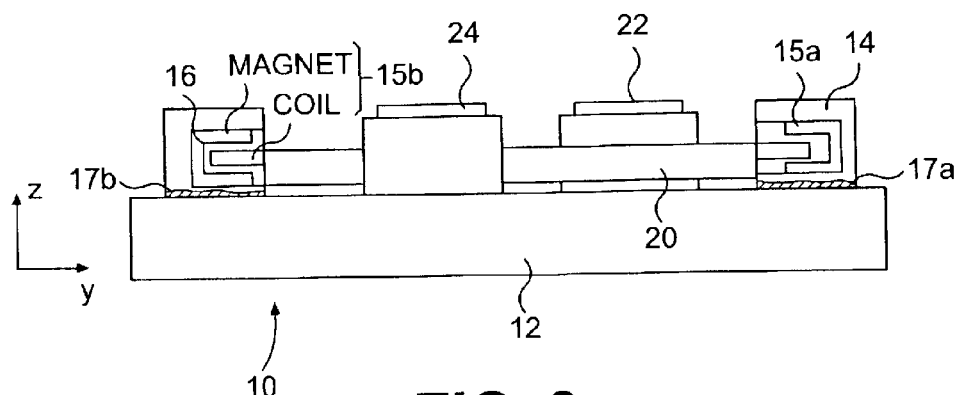
FIG. 2 is a side view of an exemplary embodiment of a wafer stage according to the present invention.

Referring to FIGS. 1 and 2, there is shown a basic configuration of a twin wafer stage system with two independent 1-dof (degree of freedom) counter masses. The wafer stage system (assembly) 10 includes a base 12, with first and second countermasses 14 and 16 and first and second guidebars 18 and 20 support thereon. It should be understood by one of ordinary skill in the art, however, that countermasses 14 and 16 may also be supported separately from the base 12. First and second wafer stages 22 and 24 are respectively disposed on first and second guidebars 18 and 20.

As shown, stages 22 and 24 move in the X direction along their respective guidebars 18 and 20. The stages 22 and 24 may also move with the respective guidebars 18 and 20 in the Y direction. In response to these Y motions, countermasses 14 and 16 move in the opposite Y direction. The amount of motion of each countermass 14 and 16 depends on the X position of the stages 22 and 24. The guidebars 18 and 20 may be driven independently from each other in the y-direction, for example, by motors 15a and 15b (shown in FIG. 2). The motors 15a and 15b are attached to the countermasses 14 and 16, respectively. The countermasses 14 and 16 are preferably heavier than the wafer stage 22 and 24 and the respective guidebar 18 and 20, and move in one degree of freedom (e.g., the y-direction). Trim motors 17a and 17b are shown between the countermasses 14 and 16 and the base 12, respectively. The trim motors 17a and 17b allow the countermasses 14 and 16 to move relative to the base 12 along the Y direction. When the stage moves in the Y direction, some torque is transferred to the ground through the trim motors.

It will be apparent to one skilled in the art that when guidebar 18 or 20 is moved in the positive y-direction, countermasses 14 and 16 will move independently in the negative y-direction. This negative y-direction movement of the countermasses 14 and 16 is due mainly because of the equal and opposite reaction force acting on the countermasses 14 and 16. The amount of motion of each countermass 14 and 16 depends on the x-position of wafer stage 22 and 24, since the x-position of wafer stage 22 and 24 affects the percentage of y-force required from each of the two motors 15a and 15b. For example, when wafer stage 22 is n FIGS. 1 and 2), a larger force is produced by the motor on the first countermass 14 than the motor on the second countermass 16. If the first and second countermasses 14 and 16 are of equal mass, the first countermass 14 will therefore move faster than the second countermass 16.

In embodiments of FIGS. 1 and 2, the reference positions of the two countermasses may change as a function of the X position of the stage (or stages). This change allows the system 10 to better cancel some of the torque produced by the stage motion, but at the expense of increased countermass stroke and trim force, as discussed in greater detail below.

An advantage of using countermasses is to maintain the combined center of gravity (CG) of the stage and countermass system in a fixed location. Motion of the CG position is a disturbance to the body, and can cause unwanted body motion. Under ideal conditions, the countermass is moved only by the reaction force from driving the stage, and the stage and countermass follow the conservation of momentum principle. That is, the total momentum of the system does not change, and the combined CG position does not move.

However, under real conditions, there are some disturbance forces (e.g., cable drag or bearing friction) that affect the countermass position, and reduce the effectiveness of the countermass. To counteract these disturbance forces, some type of countermass control system is required. This control system calculates a target position for each countermass, and applies control forces to the countermass to ensure that its actual position is substantially equal to the target position. If the target positions of the countermass follow the conservation of momentum principle, disturbances on the body will be minimized. In some embodiments, however, the control system reduces the stroke of the countermass by allowing some deviation from the conservation of momentum principle, and some CG-shift disturbance on the body is created.

Another problem with a countermass driven only by reaction force is that for some stage motions, the countermasses may be left with a residual velocity after the stage stops moving. For example, as shown in FIG. 1, assume that the stage 22 starts in the position shown (close to countermass 14), and moves diagonally in the −Y and −X directions. When the stage accelerates, a larger force is required from motor 15a than from motor 15b, because the stage is closer to countermass 14 (and motor 15a). The reaction forces therefore cause countermass 14 to begin moving in the +Y with a greater velocity than countermass 16.

When the stage is decelerated, a larger force is required from motor 15b because now the stage is closer to countermass 16. The reaction forces will therefore cause countermass 16 to begin moving in the −Y direction, and will leave countermass 14 with some velocity in the +Y direction. When the stage stops, the two countermasses will have equal (assuming their masses are equal) and opposite velocities, although the total momentum of the system is still zero.

In order to avoid center of gravity shift the following must hold true:

$$m_s(y_{S1}+y_{S2})+M_{CM}(y_1+y_2)=0 \tag{1}$$

where
$m_s$ is the mass of each stage (including the guidebar),
$y_{S1}$ and $y_{S2}$ are the y positions of each stage,
$y_1$ and $y_2$ are the y positions of each countermass; and
$M_{CM}$ is the mass of each counter mass (assuming equal masses).

Then, the average counter mass position is given as:

$$\frac{y_1+y_2}{2} = -\frac{m_s}{M_{CM}} \cdot \frac{(y_{S1}+y_{S2})}{2}$$

In the embodiments of the present invention, a reference or target position for two countermasses of different masses using the system of the present invention with two stages can thus be given as:

$$Y_T = -\frac{m_s}{(M_{CM1}+M_{CM2})} \cdot (y_{S1}+y_{S2}) \tag{2}$$

where
$Y_T$ is the target position,
$y_{S1}$ and $y_{S2}$ are the y positions of each stage, and
$M_{CM1}$ and $M_{CM2}$ is the mass of each countermass.

Similarly, in further embodiments of the present invention, the target position for the countermasses using the system of the present invention with one stage can thus be given as:

$$Y_T = -\frac{m_s}{(M_{CM1}+M_{CM2})} \cdot y_S \tag{3}$$

where
$m_s$ is the mass of the one stage (including the guidebar),
$y_s$ is the y positions of the one stage, and
$M_{CM1}$ and $M_{CM2}$ is the mass of each countermass.

In the present invention, the controller controls the motors 15a and 15b to constantly apply small forces to the countermasses to push them towards the reference or target position. This reduces countermass stroke, eliminates residual velocities, maintains conservation of momentum, and does not require advance knowledge of the stage trajectory. In embodiments, a low-bandwidth controller (for example 62 in FIG. 8) uses equation 2 or 3 to determine the reference position for both countermasses. If the stage and countermass system operated with pure conservation of momentum, equation 2 or 3 gives the average position of the two countermasses at any time. Any additional motion of the two countermasses that is symmetrical about this average position will also maintain conservation of momentum (and therefore no CG shift on the body). The invention uses the motors 15a–b to constantly push both countermasses towards the average position.

If the two countermasses exactly followed the average position, the countermass stroke is minimized, but the required trim motor force would be large. Using a high bandwidth countermass controller would create this situation. In an embodiment of the invention, a 1 Hz bandwidth of the countermass position controller is used. Because the bandwidth is low, the countermass positions do not exactly track the reference position (slightly increasing countermass stroke) and the trim motor force is small.

Figure 3:
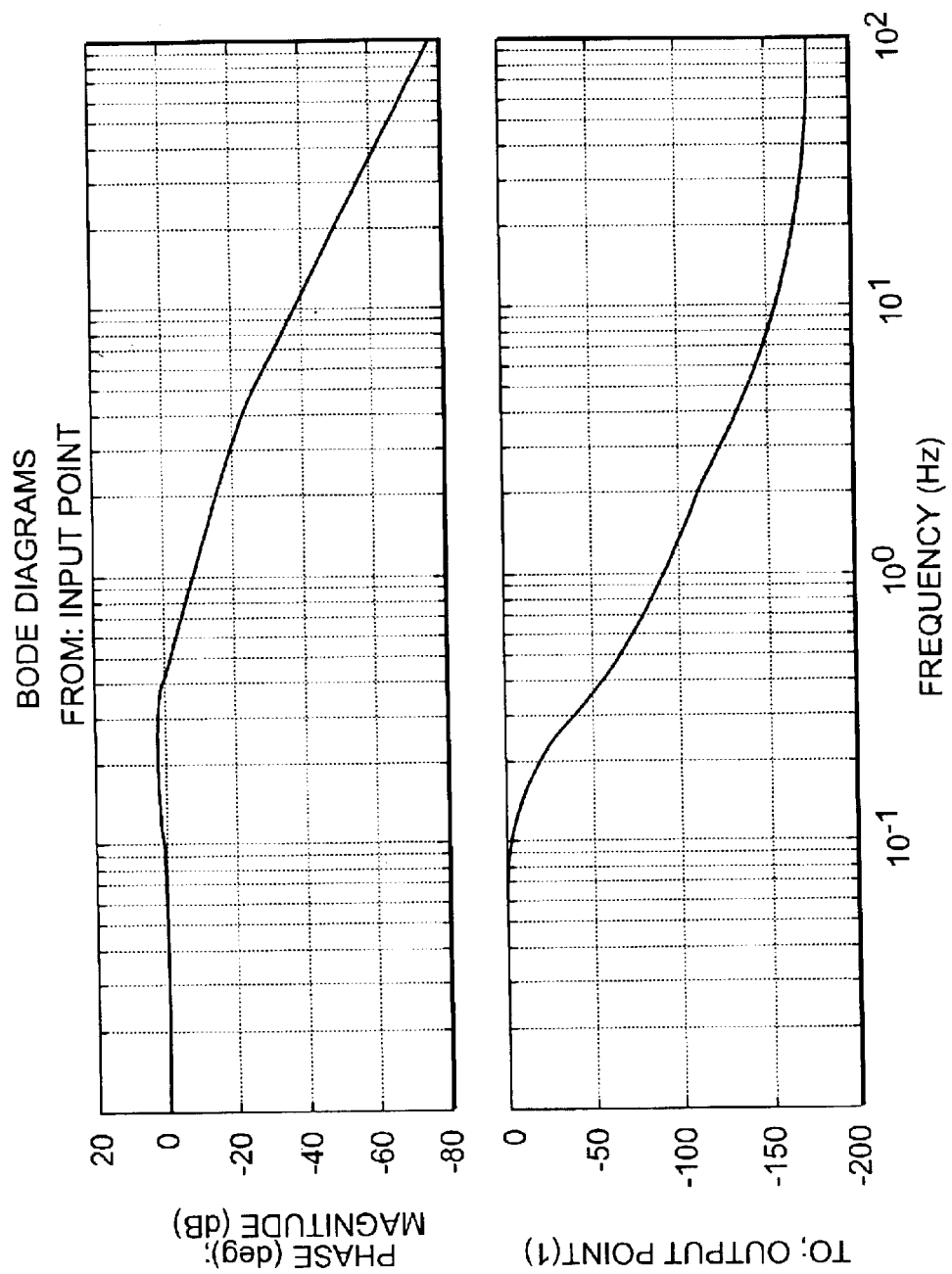
FIG. 3 is a Bode plot showing the closed-loop bandwidth of the countermass controller.

FIG. 3 is a Bode plot showing the closed-loop bandwidth of the countermass controller used in a computer simulation. It indicates the bandwidth is about 0.8 Hz.

FIGS. 4A–4D show the simulation of the stroke with a trim force applied. Here, during each exposure, small trim forces of equal but opposite force is applied to the countermasses. (FIGS. 4C and 4D.) The trim forces keep the combined center of gravity of both stages and both countermasses constant, while reducing the countermass stroke. The bottom two graphs, FIGS. 4C–4D, show the trim motor forces. As shown, ±18N is the maximum force required from the trim motors.

Figure 5:
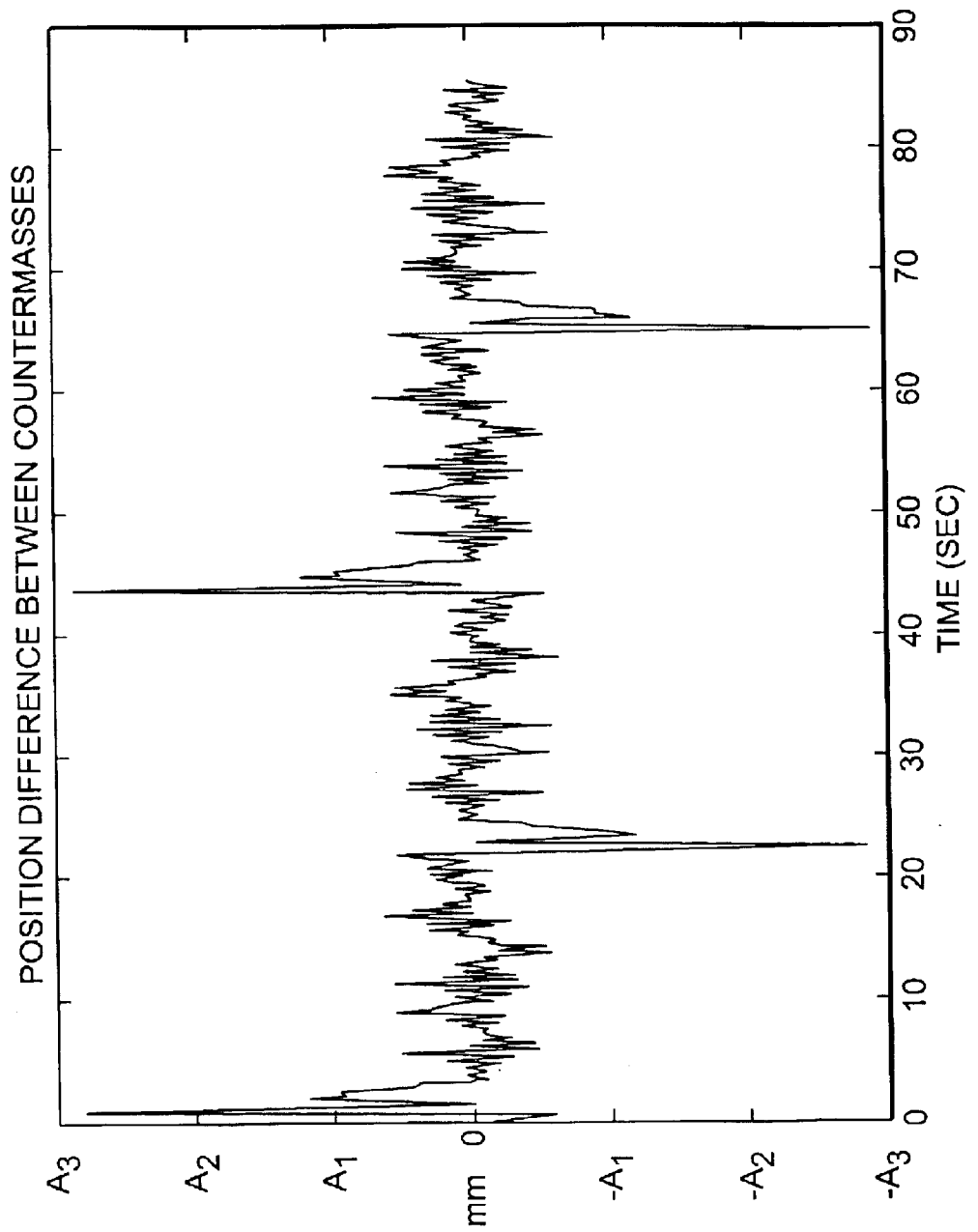
FIG. 5 is a diagram showing is a graph of the difference in countermass position versus time.

FIG. 5 is a graph of the difference in countermass position versus time. As shown, in there is approximately a maximum position difference between the two countermasses.

Figure 6:
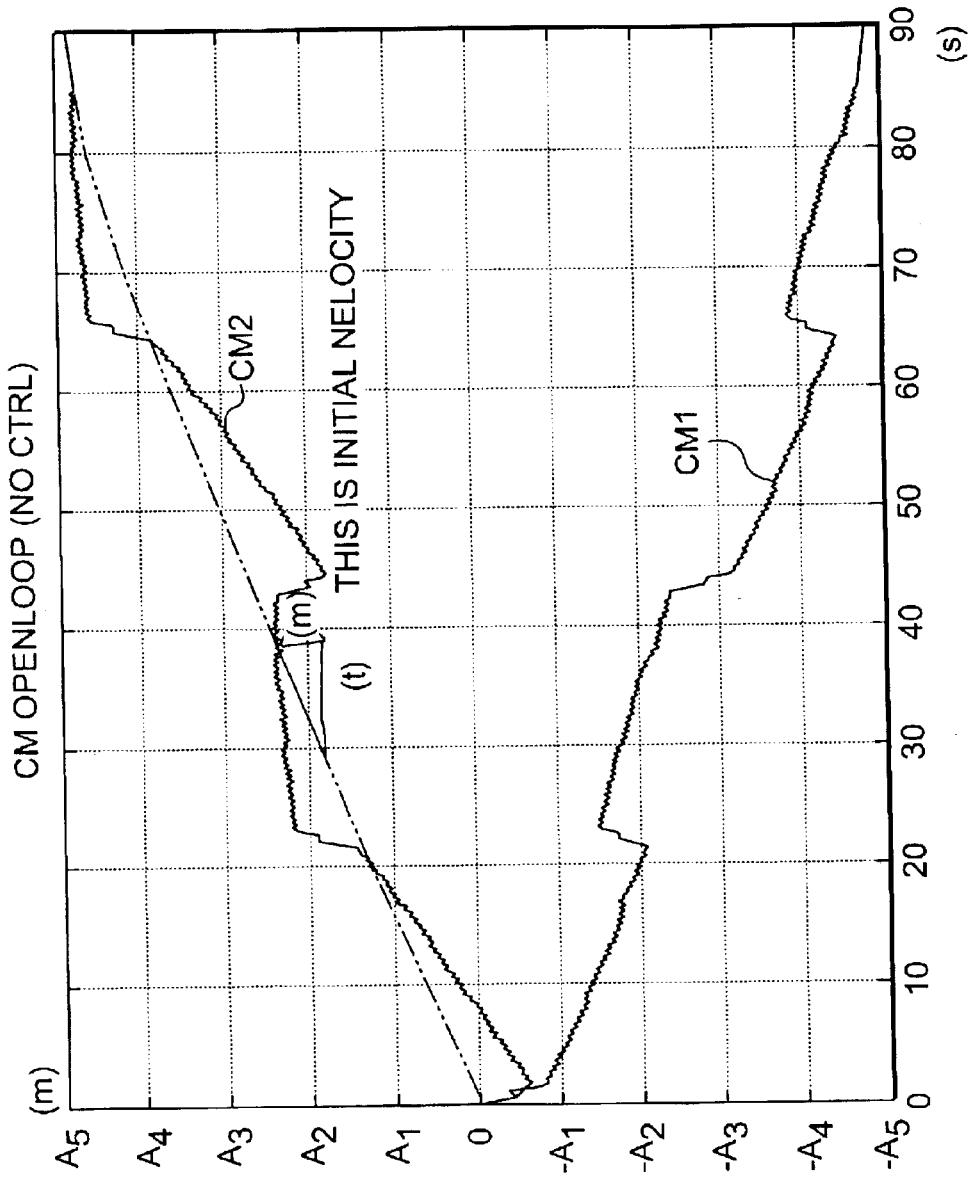
FIG. 6 is a graph showing simulation results of the countermass system of the present invention with no countermass control.

FIG. 6 is a simulation result of the countermass system with no countermass control. This simulation is an open loop simulation (i.e., no countermass control). In the simulation shown in FIG. 6, positions of the first and second countermasses versus time is shown. The straight line "L" represents the average velocity of the second countermass. As seen in this simulation, as time increases each countermass travels in substantially an equal but opposite direction.

Figure 7A:
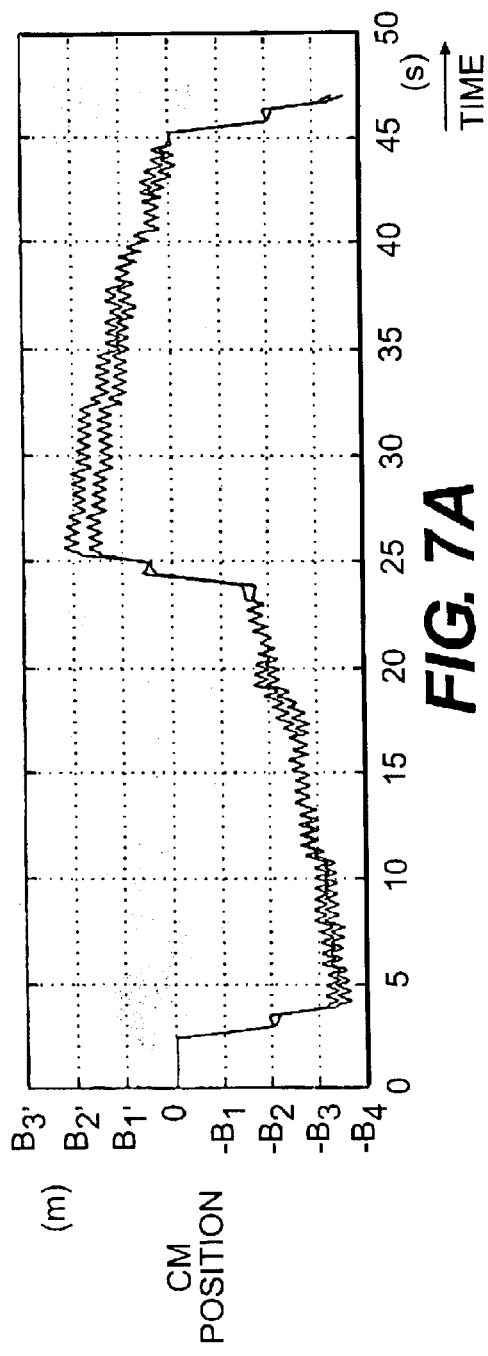
FIGS. 7A and 7B are plots showing time-domain simulation results where the positions of the two countermasses are shown in FIG. 7A and the trim motor forces are shown in FIG. 7B.
Figure 7B:
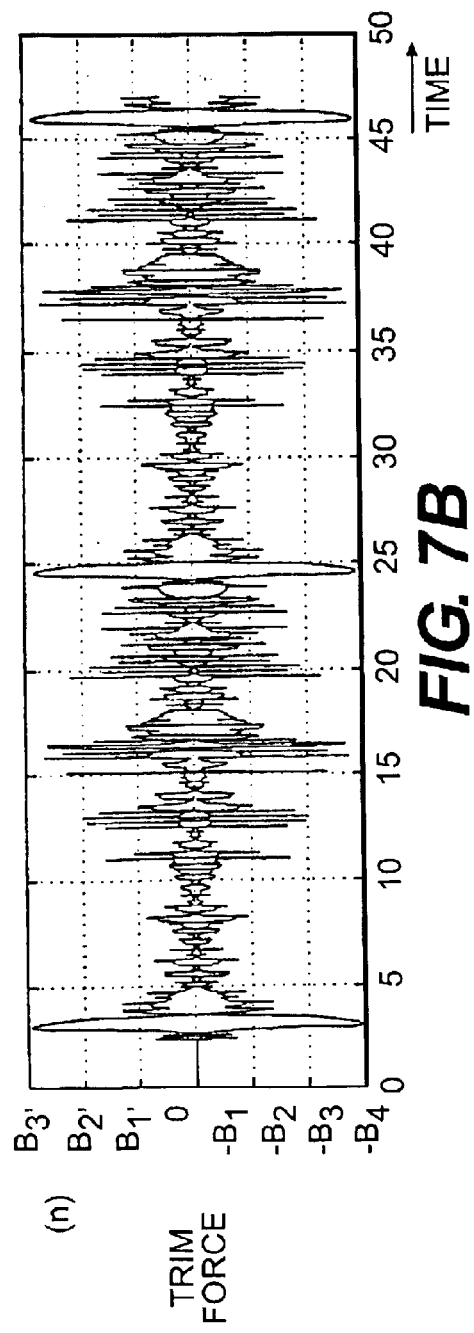

FIGS. 7A and 7B are simulation results for an embodiment of the present invention utilizing a weight factor. In the simulation associated with this embodiment, the weight fact, w, is 0.5. As discussed in detail with reference to equations 14 and 15, the weight factor may further reduce the reaction forces. FIG. 7A shows a plot of the countermass position versus time and FIG. 7B shows the trim force versus time. Similar to the discussion of FIGS. 4A–D, during each exposure, a small trim force of equal but opposite force is applied to the countermass. (FIG. 7B). The trim forces keep the combined center of gravity of both stages and both countermasses constant, while reducing the countermass stroke.

Figure 8:
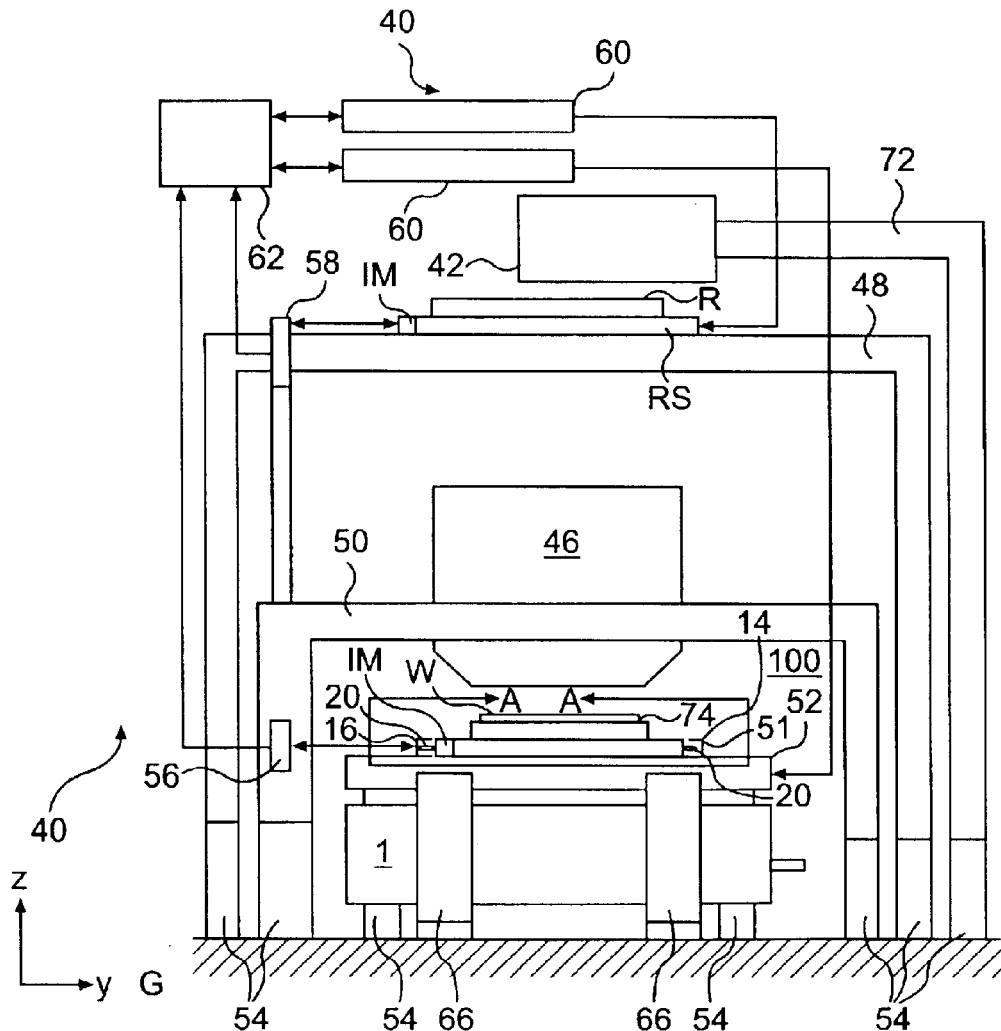
FIG. 8 is a schematic view illustrating a photolithography apparatus according to the invention.

Referring to FIGS. 1 and 8, a counter mass position controller 62 calculates the counter mass position target for a wafer stage. The controller can be, for example, a microprocessor executing a software program. The following calculations are developed for a single wafer stage (i.e., wafer stage 22 and guidebar 18 are not present). However, one of ordinary skill in the art will readily appreciate how to extend the calculation to include the twin wafer stage model.

$$m_s \ddot{y}_s = -M_{CM1}\ddot{y}_1 - M_{CM2}\ddot{y}_2 \tag{4}$$

$$-M_{CM1}\ddot{y}_1 = F_1 \tag{5}$$

$$-M_{CM2}\ddot{y}_2 = F_2 \tag{6}$$

Equations 4–6 relate the force, mass, and acceleration of the wafer stage system. For Example, in Equation 4, the mass of the stage $m_s$ multiplied by the acceleration of the stage in the Y direction is equal to the sum of the forces $F_1$ and $F_2$. The reaction forces $-F_1$ and $-F_2$ act on the counter masses $CM_1$ and $CM_2$, respectively.

Equation 7 is an equation describing the stage torque and is set equal to zero. L is the distance between the motors 15a and 15b. $X_{cg}$ is the x position of the stage and guidebar combined center of gravity.

$$I_s\ddot{\theta} = \left(\frac{L}{2} + X_{CG}\right)F_1 - \left(\frac{L}{2} - X_{CG}\right)F_2 = 0 \quad (7)$$

$$m_s\ddot{y}_s = -M_{CM1}\ddot{y}_1 - M_{CM2}\ddot{y}_2 \quad (8)$$

Substituting equations 5 and 6 for $F_1$ and $F_2$ in equation 4 yields equation 8. Integrating both sides with respect to time yields equation 9.

$$m_s y_s = -M_{CM1}Y_1 - M_{CM2}Y_2 \quad (9)$$

Substituting equations 5 and 6 for $F_1$ and $F_2$ in equation 7 yields equation 10.

$$0 = -\left(\frac{L}{2} + x_{CG}\right)M_{CM1}\ddot{y}_1 + \left(\frac{L}{2} - x_{CG}\right)M_{CM2}\ddot{y}_2 \quad (10)$$

Moving the left hand term to the other side yields equation 11.

$$\left(\frac{L}{2} + x_{CG}\right)M_{CM1}\ddot{y}_1 = \left(\frac{L}{2} - x_{CG}\right)M_{CM2}\ddot{y}_2 \quad (11)$$

Integrating both sides with respect to time yields equation 12.

$$\left(\frac{L}{2} + x_{CG}\right)M_{CM1}y_1 = \left(\frac{L}{2} - x_{CG}\right)M_{CM2}y_2 \quad (12)$$

Combining equations 9 and 12 and solving for $y_1$ and $y_2$ results in equations 13 and 14.

$$y_1 = -\frac{1}{2}m_s \frac{(L+2x_{cg})}{M_{CM1}L} y_s \quad (13)$$

$$y_2 = -\frac{1}{2}m_s \frac{(L-2x_{cg})}{M_{CM2}L} y_s \quad (14)$$

A weight factor "w" may also introduced to further reduce reaction force as shown in equations 15 and 16, where the weight factor is an arbitrary constant.

$$y_1 = -\frac{1}{2}m_s \frac{(L+2x_{cg}w)}{M_{CM1}L} y_s \quad (15)$$

$$y_2 = -\frac{1}{2}m_s \frac{(L-2x_{cg}w)}{M_{CM2}L} y_s \quad (16)$$

When w=0, these equations will give the same reference position as in the first embodiment of the present invention, and y1=y2. When the stage moves in the Y direction, some torque is transferred to the ground through the trim motors.

If w=1, the reference positions of the two countermasses are unequal. When the stage moves in the Y direction, there will be no torque required from the trim motors. The stroke of one countermass (whichever the stage is closer to) will be larger than it would if "w" were zero. Setting w to a value between 0 and 1 allows a tradeoff between reducing countermass stroke and reducing trim force applied to ground. In our simulations, we have found that w=0.5 provides a good compromise.

Figure 9:
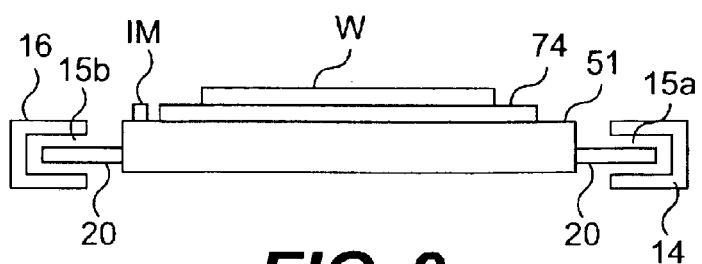
FIG. 9 is an exploded view of section A—A of FIG. 8.
Figure 10:
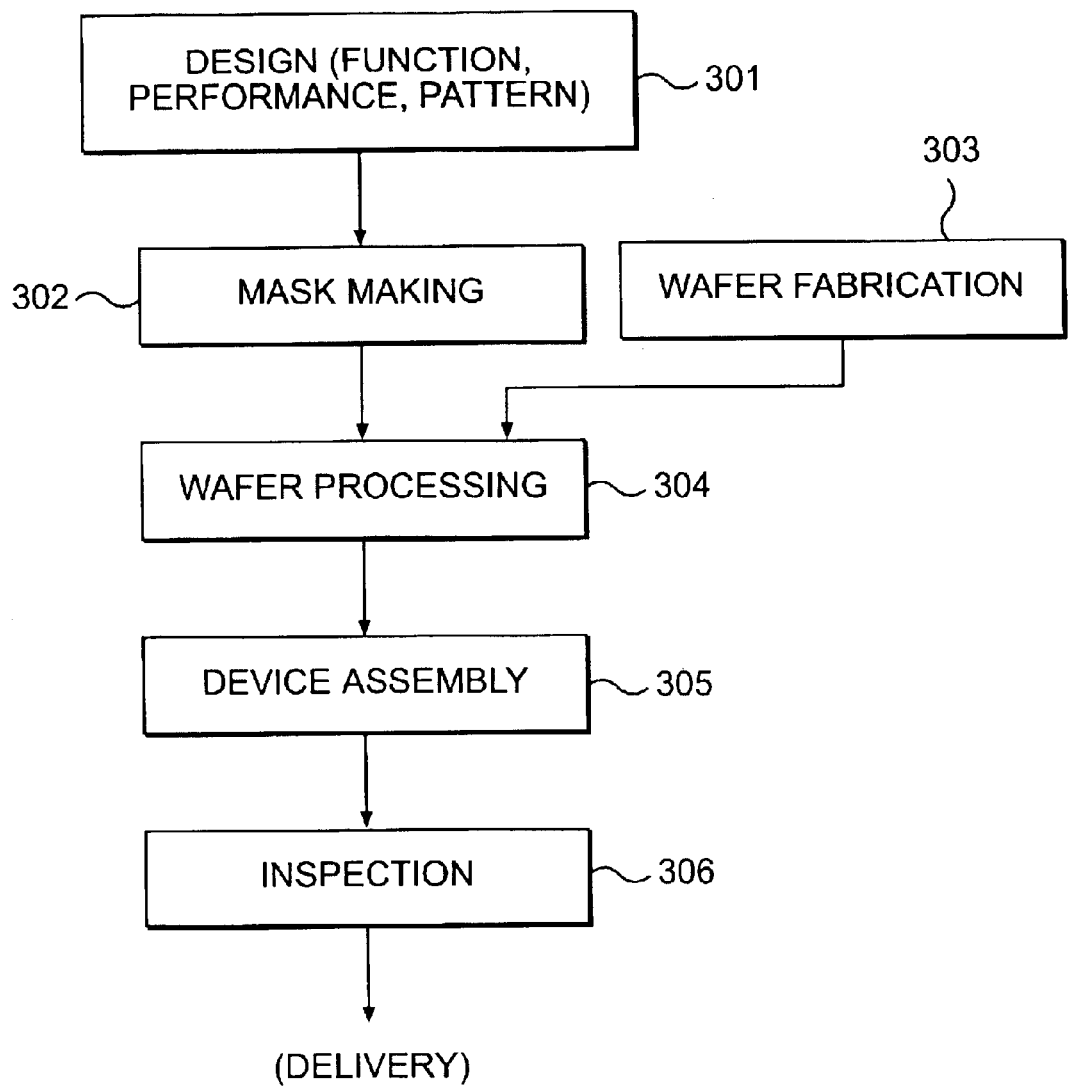
FIG. 10 is a flow chart showing semiconductor device fabrication.

FIG. 8 is a schematic view illustrating a photolithography apparatus (exposure apparatus) 40 incorporating the present invention. A wafer positioning stage 52 includes a wafer stage 51, a base 1 and a wafer chuck 74 that holds a wafer W, and an interferometer mirror IM. The base 1 is supported by a plurality of isolators 54 or, alternatively, may be on the ground or attached to the machine frame. Wafer stage 51 corresponds to stages 22 and 24 in FIGS. 1 and 2. Wafer positioning system 52 also includes the first and second guide bars 18 and 20 and the first and second countermasses 14 and 16, respectively. (FIG. 9 is an exploded view of section A—A of FIG. 8 showing the wafer stage and chuck assembly.)

Still referring to FIG. 8, the wafer positioning stage 52 is structured so that it can move the wafer stage 51 in multiple (e.g., three to six) degrees of freedom under precision control by a drive control unit 60 and system controller 62, and position the wafer W at a desired position and orientation relative to the projection optics 46. A wafer table (not shown) having three degrees of freedom (z, θx, θy) or six degrees of freedom can be attached to the wafer stage 51 to control the leveling and precise position of the wafer. The wafer table includes the wafer chuck 74, and may include at least three voice coil motors (not shown), and a bearing system. The wafer table may be levitated in the vertical plane by the voice coil motors and supported on the wafer stage 51 by the bearing system (or other equivalent system) so that the wafer table can move relative to the wafer stage 51. The wafer positioning stage 52 incorporates the wafer stage system 10 with the countermass described above. The reaction force generated by the motion of the wafer stage 51 at least in the y direction can be canceled by the motion of countermasses 14 and 16.

An illumination system 42 is supported by a frame 72 which projects radiant energy (e.g., light) through a mask pattern on a reticle R. The reticle R is supported by and scanned using a reticle stage RS. The reaction force generated by motion of the reticle stage RS can be mechanically released to the ground through a reticle stage frame 48 and the isolator 54, in accordance with the structures described in JP Hei 8-330224 and U.S. Pat. No. 5,874,820, the entire contents of which are incorporated by reference herein. The countermasses 14 and 16 may also be used with the reticle stage RS. The light is focused through a projection optical system (lens assembly) 46 supported on a projection optics frame 50 and connected to the ground through isolator 54.

An interferometer 56 is supported on the projection optics frame 50 and detects the position of the wafer stage 51 and outputs the information of the position of the wafer stage 51 in x, y, θx, θy and θz directions to the system controller 62. A second interferometer 58 is supported on the projection optics frame 50 and detects the position of the reticle stage RS and outputs the information of the position to the system controller 62. The system controller 62 controls a drive control unit 60 to position the reticle R at a desired position and orientation relative to the wafer W or the projection optics 46.

It should be understood that there are number of different types of photolithographic devices which may be implemented with the present invention. For example, apparatus 40 may comprise an exposure apparatus that can be used as a scanning type photolithography system which exposes the pattern from reticle R onto wafer W with reticle R and wafer W moving synchronously. In a scanning type lithographic device, reticle R is moved perpendicular to an optical axis of projection optics 46 by reticle stage RS and wafer W is moved perpendicular to an optical axis of projection optics 46 by wafer positioning stage 52. Scanning of reticle R and wafer W, and then occurs while reticle R and wafer W are moving synchronously in the x direction.

Alternately, exposure apparatus 40 may be a step-and-repeat type photolithography system that exposes reticle R while reticle R and wafer W are stationary. In the step and repeat process, wafer W is in a constant position relative to reticle R and projection optics 46 during the exposure of an individual field. Subsequently, between consecutive exposure steps, wafer W is consecutively moved by the wafer positioning stage 52 perpendicular to the optical axis of the projection optics 46 so that the next field of semiconductor wafer W is brought into position relative to the projection optics 46 and reticle R for exposure. Following this process, the images on reticle R are sequentially exposed onto the fields of the wafer W, and then the next field of semiconductor wafer W is brought into position relative to the projection optics 46 and reticle R.

However, the use of the apparatus 40 discussed herein is not limited to a photolithography system for semiconductor manufacturing. Apparatus 40 (e.g., an exposure apparatus), for example, may be used as an LCD photolithography system that exposes a liquid crystal display device pattern onto a rectangular glass plate or a photolithography system for manufacturing a thin film magnetic head. Further, the present invention can also be applied to a proximity photolithography system that exposes a mask pattern by closely locating a mask and a substrate without the use of a lens assembly. Additionally, the present invention provided herein can be used in other devices, including other semiconductor processing equipment, machine tools, metal cutting machines, and inspection machines.

In the illumination system 42, the illumination source can be g-line (436 nm), i-line (365 nm), KrF excimer laser (248 nm), ArF excimer laser (193 nm) and F2 laser (157 nm). Alternatively, the illumination source can also use charged particle beams such as x-ray and electron beam. For instance, in the case where an electron beam is used, thermionic emission type lanthanum hexaboride (LaB6) or tantalum (Ta) can be used as an electron gun. Furthermore, in the case where an electron beam is used, the structure could be such that either a mask is used or a pattern can be directly formed on a substrate without the use of a mask.

With respect to projection optics 46, when far ultra-violet rays such as the excimer laser is used, glass materials such as quartz and fluorite that transmit far ultra-violet rays are preferably used. When the F2 type laser or x-ray is used, projection optics 46 should preferably be either catadioptric or refractive (a reticle should also preferably be a reflective type), and when an electron beam is used, electron optics should preferably comprise electron lenses and deflectors. The optical path for the electron beams should be in a vacuum.

Also, with an exposure device that employs vacuum ultra-violet radiation (VUV) of wavelength 200 nm or lower, use of the catadioptric type optical system can be considered. Examples of the catadioptric type of optical system include the disclosure Japan Patent Application Disclosure No. 8-171054 published in the Official Gazette for Laid-Open Patent Applications and its counterpart U.S. Pat. No. 5,668,672, as well as Japanese Patent Application Disclosure No.10-20195 and its counterpart U.S. Pat. No. 5,835, 275. In these cases, the reflecting optical device can be a catadioptric optical system incorporating a beam splitter and concave mirror. Japanese Patent Application Disclosure No. 8-334695 published in the Official Gazette for Laid-Open Patent Applications and its counterpart U.S. Pat. No. 5,689, 377 as well as Japanese Patent Application Disclosure No. 10-3039 and its counterpart U.S. Pat. No. 5,892,117 also use a reflecting-refracting type of optical system incorporating a concave mirror, etc., but without a beam splitter, and can also be employed with this invention. The disclosures in the above-mentioned U.S. patents, as well as the Japanese patent applications published in the Office Gazette for Laid-Open Patent Applications are incorporated herein by reference.

Further, in photolithography systems, when linear motors that differ from the motors shown in the above embodiments (see U.S. Pat. Nos. 5,623,853 or 5,528,118) are used in one of a wafer stage or a reticle stage, the linear motors can be either an air levitation type employing air bearings or a magnetic levitation type using Lorentz force or reactance force. Additionally, the stage could move along a guide, or it could be a guideless type stage that uses no guide. The disclosures in U.S. Pat. Nos. 5,623,853 and 5,528,118 are incorporated herein by reference.

Alternatively, one of the stages could be driven by a planar motor, which drives the stage by electromagnetic force generated by a magnet unit having two-dimensionally arranged magnets and an armature coil unit having two-dimensionally arranged coils in facing positions. With this type of driving system, either one of the magnet unit or the armature coil unit is connected to the stage and the other unit is mounted on the countermasses 14 and 16.

Movement of the stages as described above generates reaction forces that can affect performance of the photolithography system. Reaction forces generated by the wafer (substrate) stage motion can be mechanically released to the floor (ground) by use of a frame member as described in U.S. Pat. No. 5,528,118 and published Japanese Patent Application Disclosure No. 8-166475. Additionally, reaction forces generated by the reticle (mask) stage motion can be mechanically released to the floor (ground) by use of a frame member as described in U.S. Pat. No. 5,874,820 and published Japanese Patent Application Disclosure No. 8-330224. The disclosures in U.S. Pat. Nos. 5,528,118 and 5,874,820 and Japanese Patent Application Disclosure No. 8-330224 are incorporated herein by reference.

As described above, a photolithography system according to the above described embodiments can be built by assembling various subsystems in such a manner that prescribed mechanical accuracy, electrical accuracy and optical accuracy are maintained. In order to maintain the various accuracies, prior to and following assembly, every optical system is adjusted to achieve its optical accuracy. Similarly, every mechanical system and every electrical system are adjusted to achieve their respective mechanical and electrical accuracies. The process of assembling each subsystem into a photolithography system includes mechanical interfaces, electrical circuit wiring connections and air pressure plumbing connections between each subsystem. Needless to say, there is also a process where each subsystem is assembled prior to assembling a photolithography system from the various subsystems. Once a photolithography system is assembled using the various subsystems, total adjustment is performed to make sure that every accuracy is maintained in the complete photolithography system. Additionally, it is desirable to manufacture an exposure system in a clean room where the temperature and humidity are controlled.

Semiconductor Fabrication Processes Implemented with the Present Invention

Semiconductor devices can be fabricated using the above described systems, by the process shown generally in FIG.

10. In step 301 the device's function and performance characteristics are designed. Next, in step 302, a mask (reticle) having a pattern is designed according to the previous designing step, and in a parallel step 303, a wafer is made from a silicon material. The mask pattern designed in step 302 is exposed onto the wafer from step 303 in step 304 by a photolithography system described herein above consistent with the principles of the present invention. In step 305, the semiconductor device is assembled (including the dicing process, bonding process and packaging process), then finally the device is inspected in step 306.

Figure 11:
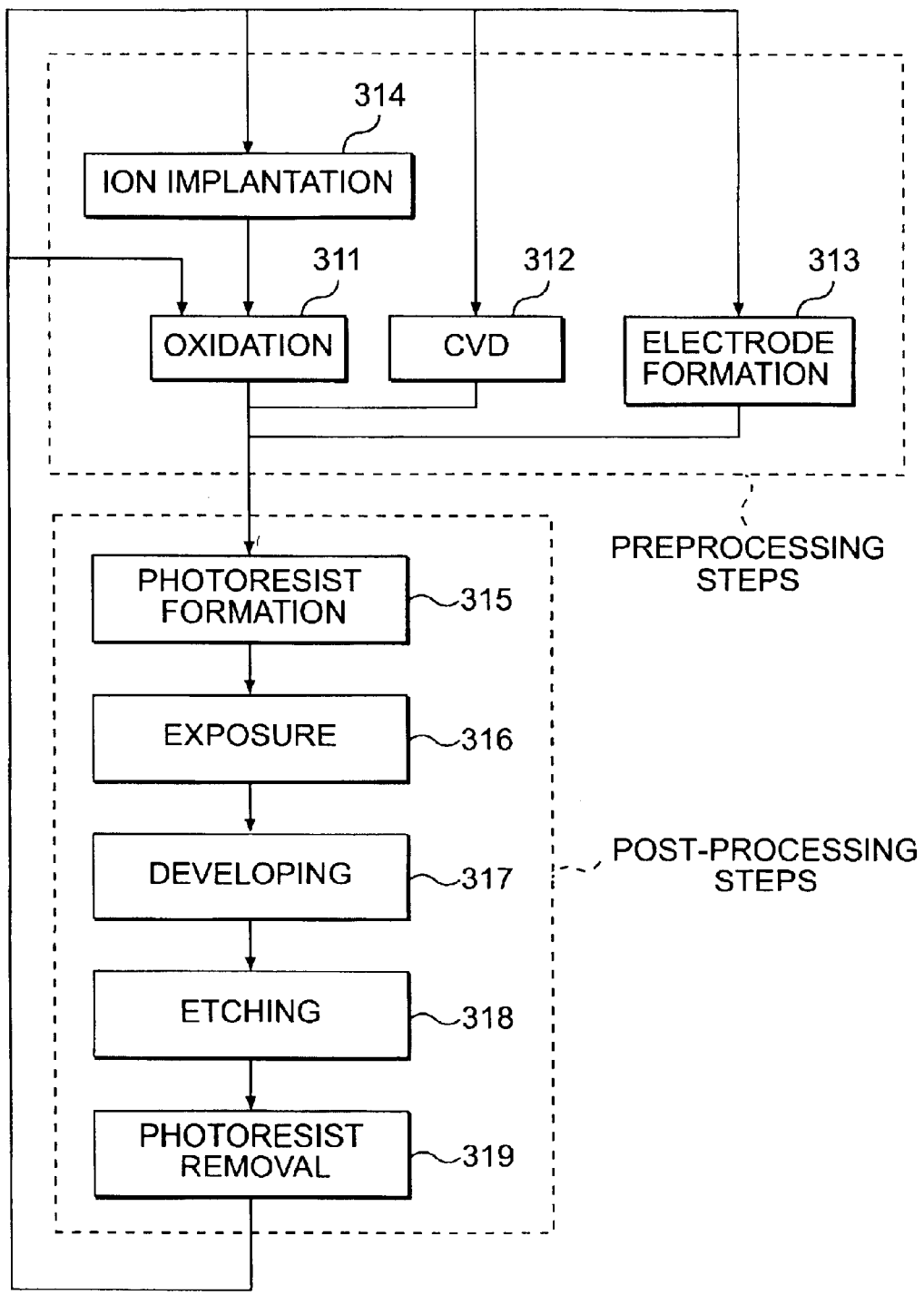
FIG. 11 is a flow chart showing wafer processing.

FIG. 11 illustrates a detailed flowchart example of the above-mentioned step 304 in the case of fabricating semiconductor devices. In step 311 (oxidation step), the wafer surface is oxidized. In step 312 (CVD step), an insulation film is formed on the wafer surface. In step 313 (electrode formation step), electrodes are formed on the wafer by vapor deposition. In step 314 (ion implantation step), ions are implanted in the wafer. The above-mentioned steps 311–314 form the preprocessing steps for wafers during wafer processing, and selection is made at each step according to processing requirements.

At each stage of wafer processing, when the above-mentioned preprocessing steps have been completed, the following post-processing steps are implemented. During post-processing, initially, in step 315 (photoresist formation step), photoresist is applied to a wafer. Next, in step 316 (exposure step), the above-mentioned exposure apparatus is used to transfer the circuit pattern of a mask (reticle) to a wafer. Then, in step 317 (developing step), the exposed wafer is developed, and in step 318 (etching step), parts other than residual photoresist (exposed material surface) are removed by etching. In step 319 (photoresist removal step), unnecessary photoresist remaining after etching is removed. Multiple circuit patterns are formed by repetition of these pre-processing and post-processing steps.

Accordingly, in a fabrication process using the assembly of the present invention, including a moving stage and at least one countermass and more preferably at least two countermasses (such as an assembly 10 of FIGS. 1 and 2), a controller actuates trim motors to apply small forces to the countermasses to push them towards a reference position to more closely track an idea trajectory and maintain the system's center of gravity and avoid undesirable vibrations.

While the invention has been described in terms of its preferred embodiment, those skilled in the art will recognize that the invention can be practiced with modifications within the spirit and scope of the appended claims. For example, one skilled in the art will recognize that, though a two-stage system is herein illustrated and described, the assembly 10 could equally be practiced in a single-stage system. Thus, it is intended that all matter contained in the foregoing description or shown in the accompanying drawings shall be interpreted as illustrative rather than limiting, and the invention should be defined only in accordance with the following claims and their equivalents.

We claim:

1. A method for maintaining a center of gravity for a stage and a countermass system in a fixed location comprising at least one moving stage and at least two countermasses, the method comprising the steps of:
   calculating a target position for said at least two countermasses according to a position of said at least one stage; and
   pushing said at least two countermasses towards said target position based on said calculating step.

2. The method according to claim 1, wherein said pushing step includes applying predetermined forces to the at least two countermasses to push the at least two countermasses towards said target position.

3. The method according to claim 2, wherein the applying of the predetermined forces substantially eliminates residual velocities, and maintains conservation of momentum.

4. The method according to claim 2, wherein the applying of the predetermined forces does not require advance knowledge of a trajectory of the at least one moving stage.

5. The method according to claim 2, wherein the predetermined forces are equal but opposite forces applied to each of the at least two countermasses.

6. The method according to claim 1, wherein the system comprises at least two stages and said target position is given as:

$$Y_T = -\frac{m_s}{(M_{CM1} + M_{CM2})} \cdot \frac{(y_{S1} + y_{S2})}{2}$$

where $Y_T$ is the target position, $y_{S1}$ and $y_{S2}$ are the y positions of each stage, and $M_{CM1}$ and $M_{CM2}$ is the mass of each countermass.

7. The method according to claim 6, wherein the predetermined forces are equal but opposite forces applied to each of the at least two countermasses and further maintain a combined center of gravity of the at least two stages and countermasses constant.

8. The method according to claim 1, wherein said at least two countermasses are first and second countermasses which move substantially symmetrically around said target position.

9. The method according to claim 1, wherein said at least one stage is one stage and said target position is given as:

$$Y_T = -\frac{m_s}{(M_{CM1} + M_{CM2})} \cdot y_S$$

where $m_s$ is the mass of the one stage, $Y_S$ is the y positions of the one stage, and $M_{CM1}$ and $M_{CM2}$ is the mass of each countermass.

10. The method according to claim 1, wherein said target position is an average position of the at least two countermasses at any time.

11. The method according to claim 10, wherein any additional motion of said at least two countermasses is substantially symmetrical about the average position maintains conservation of momentum and eliminates substantially all of the center of gravity shift of the stage.

12. A control method for maintaining a center of gravity for a stage and a countermass system comprising a moving stage and at least two countermasses having different target positions, the method comprising the steps of:
   calculating the target positions for said at least two countermasses according to a position of said stage, said calculating step allowing for a weight factor to trade off torque cancellation for reduced countermass stroke; and
   pushing said at least two countermasses towards said different target positions.

13. The method of claim 12, wherein said different target positions are given as:

$$y_1 = -\frac{1}{2}m_s\frac{(L+2x_{cg}w)}{M_{CM1}L}y_s$$

$$y_2 = -\frac{1}{2}m_s\frac{(L-2x_{cg}w)}{M_{CM2}L}y_s$$

where $m_s$ is the mass of each stage,

L is a distance between motors providing a force for pushing each countermass, $x_{cg}$ is the x position of the center of gravity of the stage, w is an arbitrary weight factor, $y_s$ is the stage y position, $y_1$ and $y_2$ are the y positions of each countermass; and $M_{CM1}$ and $M_{CM2}$ is the mass of each countermass.

14. The method according to claim 13, wherein the weight factor, w, is between 0 and 1.

15. The method according to claim 13, wherein:

when w=0, y1=y2 and when the stage moves in the Y direction, torque is transferred to ground;

when w=1, the different target positions of the two countermasses are unequal and when the stage moves in the Y direction, there will be no net torque transferred to ground.

16. The method according to claim 14, wherein w=0.5.

17. A system for maintaining a center of gravity for a stage and a countermass system in a fixed location comprising at least one moving stage and at least two countermasses, the system comprising:

a controller that calculates a target position for said at least two countermasses according to a position of said at least one stage; and a motor that pushes said at least two countermasses towards said target position based on said calculating.

18. The system according to claim 17, wherein said motor applies a predetermined forces to the at least two countermasses to push the at least two countermasses towards said target position.

19. The system according to claim 18, wherein the predetermined forces substantially eliminates residual velocities, and maintains conservation of momentum.

20. The system according to claim 18, wherein the motors apply equal but opposite forces to each of the at least two countermasses.

21. The system according to claim 17, wherein the system comprises at least two stages and said target position is given as:

$$Y_T = -\frac{m_s}{(M_{CM1}+M_{CM2})}\cdot\frac{(y_{S1}+y_{S2})}{2}$$

where $Y_T$ is the target position, $y_{S1}$ and $y_{S2}$ are the y positions of each stage, and $M_{CM1}$ and $M_{CM2}$ is the mass of each countermass.

22. The system according to claim 17, wherein said at least one stage is one stage and said target position is given as:

$$Y_T = -\frac{m_s}{(M_{CM1}+M_{CM2})}\cdot y_s$$

where $m_s$ is the mass of the one stage, $y_S$ is the y positions of the one stage, and $M_{CM1}$ and $M_{CM2}$ is the mass of each countermass.

23. A control system for maintaining a center of gravity for a stage and a countermass system comprising a moving stage and at least two countermasses having different target positions, the system comprising:

a controller that calculates the target positions for said at least two countermasses according to a position of said stage, said calculating step allowing for a weight factor to trade off torque cancellation for reduced countermass stroke; and a motor that pushes said at least two countermasses towards said two different target positions.

24. The control system of claim 23, wherein said different target positions are given as:

$$y_1 = -\frac{1}{2}m_s\frac{(L+2x_{cg}w)}{M_{CM1}L}y_s$$

$$y_2 = -\frac{1}{2}m_s\frac{(L-2x_{cg}w)}{M_{CM2}L}y_s$$

where $m_s$ is the mass of each stage,

L is a distance between motors providing a force for pushing each countermass, $x_{cg}$ is the x position of the center of gravity of the stage, w is an arbitrary weight factor, $y_s$ is the stage y position, $y_1$ and $y_2$ are the y positions of each countermass; and $M_{CM1}$ and $M_{CM2}$ is the mass of each countermass.

25. The control system according to claim 24, wherein the weight factor, w, is between 0 and 1.

26. The control system according to claim 23, wherein the stage includes a stage assembly comprising:

a wafer stage supported by a base;

a wafer table supported by the wafer stage;

an interferometer mirror IM mounted to the wafer table; and a wafer chuck mounted on the wafer table, the wafer chuck adapted to hold a wafer.

27. A system for maintaining a center of gravity for a stage and a countermass system in a fixed location comprising at least one moving stage and at least two countermasses, the system comprising:

means for calculating a target position for said at least two countermasses according to a position of said at least one stage; and means for pushing said at least two countermasses towards said target position based on said calculating step.

28. A system for maintaining a center of gravity for a stage and a countermass system in a fixed location, comprising:

at least two countermasses;

at least one guide bar having at least one stage disposed thereon, respectively, said at least one guide bar being mounted to the at least two countermasses;

a controller that calculates a target position for said at least two countermasses according to a position of said at least one stage; and a motor that pushes said at least two countermasses toward said target positions.

29. An exposure apparatus, comprising:

an illumination system that projects radiant energy through a mask pattern on a reticle R; and a system that reduces a stroke of at least two countermasses in an assembly comprising at least one moving stage and the at least two countermasses, the radiant energy being projected on a wafer positioned on the at least one moving stage, the system comprising:

a controller that calculates a target position for said at least two countermasses according to a position of said at least one stage; and a motor that pushes said at least two countermasses towards said target position based on said calculating.

30. A device manufactured by a lithographic process using the exposure apparatus of claim 29.

31. A wafer on which an image has been formed by the exposure apparatus of claim 29.

32. A new system comprising;

at least one bar member, the at least one bar member being movable in at least one direction;

at least one moving stage, the at least one moving stage being provided to its respective bar member of the at least one bar member and being movable along the respective bar member;

at least two countermasses, the at least two countermasses being movable in accordance with movement of the at least one bar member;

a detector that detects a position of the at least one moving stage;

a controller connected to the detector, the controller deciding a target position for the at least two countermasses according to the position of the at least one moving stage; and a drive device connected to the at least two countermasses and the controller, the drive device moving the at least two countermasses toward the target position.

33. The stage system according to claim 32, wherein a center of gravity for the at least one moving stage, the at least one bar member, and the at least two countermasses is maintained in a fixed location when the at least one bar member is moving in the at least one direction.

34. The stage system according to claim 32, wherein the at least one moving stage is movable along its respective bar member in a first direction, and movable with the respective bar member in a second direction that differs form the first direction.

35. The stage system according to claim 33, wherein the at least two countermasses are movable in the second direction by the drive device.

36. The stage system according to claim 32, wherein the at least one moving stage is one moving stage and the target position is given as:

$$Y_T = -(m_s \cdot y_s)/(M_{cm1} + M_{cm2})$$

where $m_s$ is the mass of the one moving stage, $y_s$ is the position along the at least one direction of the one moving stage, and $M_{CM1}$ and $M_{CM2}$ is the mass of each countermass.

37. An exposure apparatus comprising:

an illumination system that irradiates radiant energy; and the stage system according to the claim 32, the stage system disposes an object on a path of the radiant energy.

38. A process for manufacturing a device including the step of utilizing the exposure apparatus according to claim 37.

39. A process for making a wafer on which an image has been formed including the step of utilizing the exposure apparatus according to claim 37.

* * * * *